(12) United States Patent
Hübner

(10) Patent No.: US 6,867,479 B2
(45) Date of Patent: Mar. 15, 2005

(54) METHOD FOR REWIRING PADS IN A WAFER-LEVEL PACKAGE

(75) Inventor: Michael Hübner, Schönau (DE)

(73) Assignee: Infineon Technologies AG, Munich (DE)

(*) Notice: Subject to any disclaimer, the term of this patent is extended or adjusted under 35 U.S.C. 154(b) by 166 days.

(21) Appl. No.: 10/247,575

(22) Filed: Sep. 19, 2002

(65) Prior Publication Data

US 2003/0052397 A1 Mar. 20, 2003

(30) Foreign Application Priority Data

Sep. 19, 2001 (DE) .......................................... 101 46 176

(51) Int. Cl.⁷ ............................................. H01L 23/544
(52) U.S. Cl. ..................... 257/620; 438/113; 438/458; 438/462
(58) Field of Search .......................... 257/620; 438/113, 438/458, 462

(56) References Cited

U.S. PATENT DOCUMENTS 5,696,404 A * 12/1997 Murari et al. ............... 257/620
5,923,047 A    7/1999 Chia et al.

FOREIGN PATENT DOCUMENTS

| JP | 06 151 535 A | 5/1994 |
| JP | 10 050 780 A | 2/1998 |
| JP | 10 125 745 A | 5/1998 |
| JP | 11 330 176 A | 11/1999 |

* cited by examiner

Primary Examiner—Thien F. Tran
(74) Attorney, Agent, or Firm—Laurence A. Greenberg; Werner H. Stemer; Gregory L. Mayback

(57) ABSTRACT

A method for rewiring contact pads in the wafer-level package is inventively provided. In order to be able to make the terminals of the characterization pads available for testing in a wafer-level package without these terminals being available later to the end user, the invention provides that the rewiring line is led via the scribe line of the wafer.

5 Claims, 1 Drawing Sheet

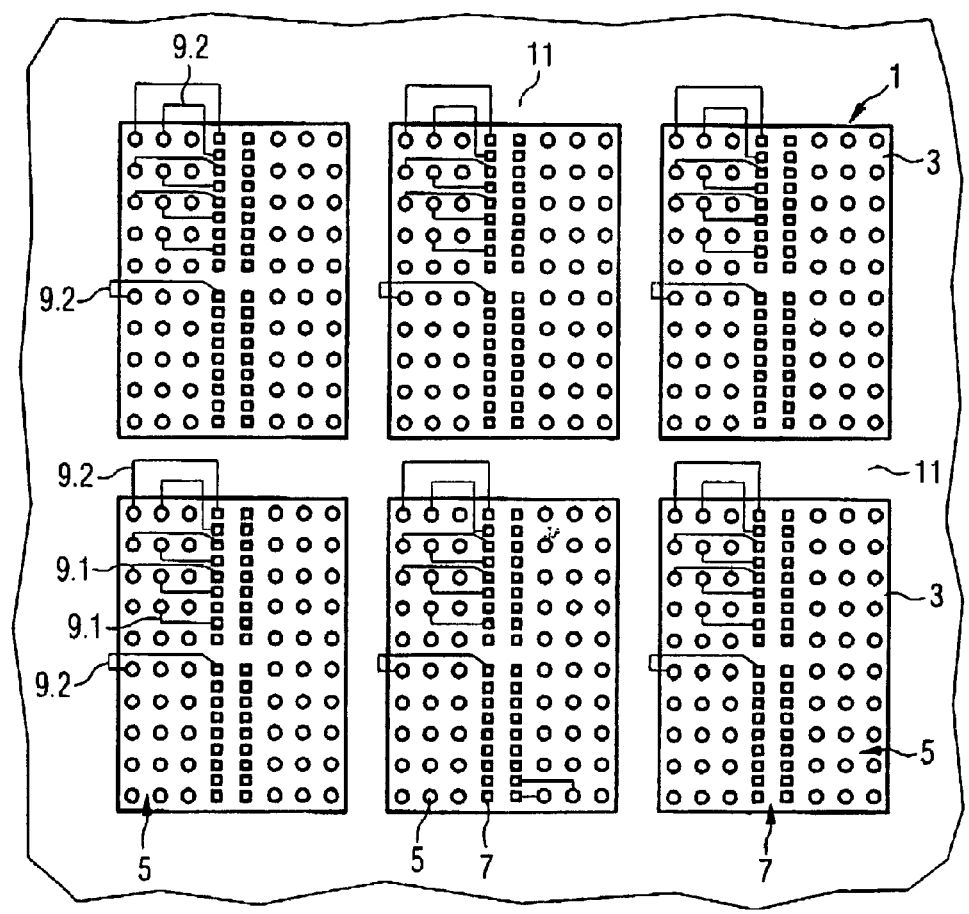

METHOD FOR REWIRING PADS IN A WAFER-LEVEL PACKAGE

BACKGROUND OF THE INVENTION

Field of the Invention

The present invention relates to a method for rewiring pads in a wafer-level package and to a correspondingly fabricated semiconductor chip.

In prior art memory chips, for example, there are additional terminals besides the terminals that are used for normal module operation. These terminals serve for characterizing the chip and for setting some internal voltage values in the wafer test. In a standard package, for example, a TSOP (thin small outline package) or a similar package, the terminals are not led to the outside. This saves pins at the package and prevents the end user from adversely affecting the electrical behavior of the modules by applying false voltage values at these terminals. In particular, this makes it impossible for the chip to be destroyed by unintentionally applied voltages. In the conventional wafer test, these pads and the pads that are used for normal chip operation are contacted by a probe card and are thus made conductively accessible.

The prior art also teaches mounting a wafer-level package on the wafer plane prior to the first test. But probe cards can not be used when testing a wafer that has already been processed with a wafer-level package. Instead, the existing terminals, such as, solder balls or micro springs must be used for the electrical contacting. But this also means that the characterization pads of the chip must be led by a rewiring to terminals that can be electrically tapped from outside, and this is associated with the disadvantages described above.

SUMMARY OF THE INVENTION

It is accordingly an object of the invention to provide a rewiring method for a wafer-level package and a corresponding semiconductor chip which overcome the above-mentioned disadvantages of the prior art methods and apparatus of this general type.

With the foregoing and other objects in view there is provided, in accordance with the invention, a method for rewiring contact pads of a chip on a wafer in a wafer-level package, which comprises: leading a rewiring line via a scribe line of the wafer.

In accordance with an added feature of the invention, the majority of the length of the rewiring line is led on the scribe line.

In accordance with an additional feature of the invention, the rewiring line electrically connects one of the contact pads to a terminal pin.

With the foregoing and other objects in view there is provided, in accordance with the invention, a semiconductor chip, including: contact pads; terminal pins; a scribe line; and at least one rewiring line for electrically connecting one of the contact pads to one of the terminal pins during testing before the scribe line is sawed. The rewiring line is led via the scribe line so that the rewiring line will be interrupted when the scribe line is sawed.

With the foregoing and other objects in view there is provided, in accordance with the invention, a semiconductor chip, including: contact pads; terminal pins; a sawn edge obtained by sawing a scribe line; and at least one rewiring line configured for electrically connecting one of the contact pads to one of the terminal pins during testing before sawing the scribe line. The rewiring line is led to the edge such that the rewiring line is interrupted after the scribe line was sawed.

With the foregoing and other objects in view there is provided, in accordance with the invention, a semiconductor chip, including: contact pads; terminal pins; a sawn edge obtained by sawing a scribe line; a portion of a rewiring line electrically connected to one of the contact pads and leading to the edge; and a portion of a rewiring line electrically connected to one of the terminal pins and leading to the edge.

The solution consists in leading the rewiring of the characterization pads, i.e. the connection between the pads and the terminals of the wafer-level package (micro spring or solder ball), by way of the scribe line of the wafer. The characterization pads are thus accessible by way of the terminals of the wafer-level package as long as the wafer has not yet been sawed apart. After sawing, the scribe line is gone and the rewiring line is open. An extra processing step for opening the lines when fabricating the semiconductor product can be inventively forgone. The terminals of the characterization pads can thus be made available for testing in the wafer-level package without being accessible later to the end user.

The terminals/contact elements that are no longer conductively connected to the chip can advantageously take over mechanical tasks such as improving the stability and the rigidity of the chip. Such "support balls" already exist in several package designs.

The technical realization of the inventive rewiring is easy when the characterization pads are located at the edge of the chip in the vicinity of the scribe line. The corresponding rewiring lines thereby extend primarily on the scribe line, and they occupy little space on the chip itself.

Other features which are considered as characteristic for the invention are set forth in the appended claims.

Although the invention is illustrated and described herein as embodied in a method for rewiring pads in a wafer-level package, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The sole drawing FIGURE schematically shows a portion of a wafer with a plurality of semiconductor memory chips.

DESCRIPTION OF THE PREFERRED EMBODIMENTS

Referring now to the sole drawing FIGURE in detail, there is schematically shown a portion of a wafer 1 with a plurality of semiconductor memory chips 3. This FIGURE will be used to illustrate an inventive rewiring method and a method for fabricating a semiconductor product. The method is not limited to being used with semiconductor memory chips, but rather can be used with a number of different types of semiconductor chips.

A number of memory chips 3 are arranged on the wafer 1. The chip 3 comprises three columns of terminal pins 5 in the form of solder balls with two columns of contact pads 7 between them on each side. Typically, some 6 to 10 of the contact pads on each chip serve as what are known as characterization pads of the chip. For testing purposes, specific terminal pins 5 are conductively interconnected with specific contact pads 7 over a rewiring line. To that end, first rewiring lines 9.1 are constructed on the chip itself, while second rewiring lines 9.2 are led via a scribe line 11 of the wafer 1. Without the rewiring, the memory circuit (not represented) is connected only to the contact pads 7. The memory circuit, however, is now interconnected with the contact pads 7 via specific terminal pins 5 by the rewiring. The characterization pads 7 are thus accessible by way of the terminals (terminal pads 5) of a wafer-level package as long as the wafer 1 has not yet been sawed. With the sawing of the wafer 1, the scribe line 11 disappears, and the rewiring that is realized by the second rewiring lines 9.2 that are led via the scribe line is dismantled. The characterization pads 7 are not longer conductively connected to the corresponding terminal pads 5. On the other hand, the interconnection realized by the first rewiring lines 9.1, which are for the control and data lines and for the current supply, and which are necessary for the normal operation of the chip, remain intact.

For simplification purposes, not all of the rewiring lines 9 are represented in the FIGURE. The memory cells and the logic/interface circuits of the chip 3 are also not shown.

I claim:

1. A method for rewiring contact pads of a chip, which comprises:

placing the chip on a wafer in a wafer-level package, the wafer-level package having a wiring layer with terminal pins; and leading a rewiring line via a scribe line of the wafer to electrically connect one of the contact pads to one of the terminal pins.

2. The method according to claim 1, wherein:

a majority of a length of the rewiring line is led on the scribe line.

3. A semiconductor chip in combination with a wafer-level package, comprising:

contact pads;

terminal pins as part of the wafer-level package;

a scribe line; and at least one rewiring line for electrically connecting one of said contact pads to one of said terminal pins during testing before said scribe line is sawed;

said rewiring line being led via said scribe line so that said rewiring line will be interrupted when said scribe line is sawed.

4. A semiconductor chip in combination with a wafer-level package, comprising:

contact pads;

terminal pins as part of the wafer-level package;

a sawn edge obtained by sawing a scribe line; and at least one rewiring line configured for electrically connecting one of said contact pads to one of said terminal pins during testing before sawing said scribe line;

said rewiring line being led to said edge such that said rewiring line is interrupted after said scribe line was sawed.

5. A semiconductor chip in combination with a wafer-level package, comprising:

contact pads;

terminal pins as part of the wafer-level package;

a sawn edge obtained by sawing a scribe line;

a portion of a rewiring line electrically connected to one of said contact pads and leading to said edge; and a portion of a rewiring line electrically connected to one of said terminal pins and leading to said edge.

* * * * *